(12) United States Patent
Lee et al.

(10) Patent No.: US 11,762,009 B2
(45) Date of Patent: Sep. 19, 2023

(54) CHAMBER MODULE AND TEST HANDLER INCLUDING THE SAME

(71) Applicant: SEMES CO., LTD., Cheonan-si (KR)

(72) Inventors: Hyon Jin Lee, Gumi-si (KR); Jun Seok Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 135 days.

(21) Appl. No.: 17/406,751

(22) Filed: Aug. 19, 2021

(65) Prior Publication Data

US 2022/0065920 A1 Mar. 3, 2022

(30) Foreign Application Priority Data

Aug. 31, 2020 (KR) .................. 10-2020-0110424

(51) Int. Cl.
*G01R 31/26* (2020.01)
*H01L 21/677* (2006.01)
*H01L 21/673* (2006.01)

(52) U.S. Cl.
CPC .... *G01R 31/2642* (2013.01); *H01L 21/67745* (2013.01); *H01L 21/67333* (2013.01)

(58) Field of Classification Search
None
See application file for complete search history.

(56) References Cited

U.S. PATENT DOCUMENTS

2017/0102427 A1* 4/2017 Lee .................. G01R 31/31718

FOREIGN PATENT DOCUMENTS

| KR | 10-0709114 | | 4/2007 |
|---|---|---|---|
| KR | 20070074262 A | * | 7/2007 |
| KR | 10-1104413 | | 1/2012 |
| KR | 10-2016-0053157 | | 5/2016 |

* cited by examiner

*Primary Examiner* — Patrick Assouad
*Assistant Examiner* — Haidong Zhang
(74) *Attorney, Agent, or Firm* — KILE PARK REED & HOUTTEMAN PLLC

(57) ABSTRACT

A chamber module and a test handler including the same are disclosed. The chamber module includes a soak chamber providing a temperature adjusting space for adjusting a temperature of semiconductor devices, an elevating member disposed in the soak chamber and for elevating a tray in which the semiconductor devices are accommodated, a guide member extending in a vertical direction in the soak chamber and for guiding movement of the elevating member, and a temperature adjusting part for adjusting a temperature of the guide member.

18 Claims, 8 Drawing Sheets

CHAMBER MODULE AND TEST HANDLER INCLUDING THE SAME

CROSS-REFERENCE TO RELATED APPLICATION

This application claims the priority benefit of Korean Patent Application No. 10-2020-0110424, filed on Aug. 31, 2020, and all the benefits accruing therefrom under 35 U.S.C. § 119, the contents of which are incorporated by reference in their entirety.

TECHNICAL FIELD

The present disclosure relates to a chamber module and a test handler including the same. More specifically, the present disclosure relates to a chamber module for performing an electrical test process on semiconductor devices and a test handler including the chamber module.

BACKGROUND

Semiconductor devices may be determined as good or defective through an electrical test process. The test process may be performed using a test handler for handling the semiconductor devices and a tester for providing test signals to electrically test the semiconductor devices.

The test process may be performed after accommodating the semiconductor devices in insert assemblies mounted on a test tray and electrically connecting the semiconductor devices to the tester. The test handler for performing the test process may include a chamber module for performing the test process, a loader module for accommodating the semiconductor devices in the test tray and transferring the test tray into the chamber module, and an unloader module for unloading the test tray from the chamber module after the test process is performed and classifying the semiconductor devices according to test results of the semiconductor devices.

The chamber module may include a soak chamber for adjusting a temperature of the semiconductor devices to a test temperature, a test chamber in which the test process on the semiconductor devices is performed, and a de-soak chamber for restoring the temperature of the semiconductor devices to room temperature. The soak chamber may be used for preheating or pre-cooling of the semiconductor devices and may include an elevator for transferring the test tray. For example, the soak chamber may preheat the semiconductor devices to about 150° C. or pre-cool the semiconductor devices to about −60° C. However, thermal deformation may occur in the elevator while the temperature of the semiconductor devices is adjusted, thereby causing a problem in that the elevator is damaged.

SUMMARY

Embodiments of the present invention provide a chamber module capable of preventing damage to an elevator inside a soak chamber and a test handler including the same.

In accordance with an aspect of the present invention, a chamber module may include a soak chamber configured to provide a temperature adjusting space for adjusting a temperature of semiconductor devices, an elevating member disposed in the soak chamber and configured to elevate a tray in which the semiconductor devices are accommodated, a guide member extending in a vertical direction in the soak chamber and configured to guide movement of the elevating member, and a temperature adjusting part configured to adjust a temperature of the guide member.

In accordance with some embodiments of the present invention, the guide member may have a form of a hollow shaft, and the temperature adjusting part may supply a temperature adjusting medium into a hollow of the guide member.

In accordance with some embodiments of the present invention, a dry air may be used as the temperature adjusting medium.

In accordance with some embodiments of the present invention, the guide member may extend in the vertical direction through the elevating member, and a bush member surrounding the guide member may be mounted to the elevating member.

In accordance with some embodiments of the present invention, the chamber module may further include guide rails configured to guide both side portions of the elevating member in the vertical direction.

In accordance with some embodiments of the present invention, the guide member may have a protective layer formed by a surface treatment.

In accordance with another aspect of the present invention, a chamber module may include a soak chamber configured to provide a temperature adjusting space for adjusting a temperature of semiconductor devices, an elevating member disposed in the soak chamber and configured to elevate a tray in which the semiconductor devices are accommodated, a first guide member extending in a vertical direction in the soak chamber and configured to guide movement of the elevating member, a second guide member extending in the vertical direction in the soak chamber, disposed to be spaced apart from the first guide member in a first horizontal direction, and configured to guide the movement of the elevating member, and a temperature adjusting part configured to adjust a temperature of the first and second guide members.

In accordance with some embodiments of the present invention, each of the first and second guide members may have a form of a hollow shaft, and the temperature adjusting part may supply a temperature adjusting medium into hollows of the first and second guide members.

In accordance with some embodiments of the present invention, a dry air may be used as the temperature adjusting medium and may be supplied into the soak chamber through the first and second guide members.

In accordance with some embodiments of the present invention, the chamber module may further include a test chamber connected to the soak chamber and configured to provide a test space for electrically testing the semiconductor devices, and a de-soak chamber connected to the test chamber and configured to restore the temperatures of the semiconductor devices to a room temperature.

In accordance with some embodiments of the present invention, the elevating member may include a first elevating member guided in the vertical direction by the first guide member, and a second elevating member guided in the vertical direction by the second guide member.

In accordance with some embodiments of the present invention, the chamber module may further include a slide unit connecting the first elevating member and the second elevating member to each other so that the first elevating member and the second elevating member are relatively movable to each other in the first horizontal direction.

In accordance with some embodiments of the present invention, the chamber module may further include first mounting units for mounting the first and second guide members in the soak chamber to enable thermal expansion or contraction of the first and second guide members. In such case, each of the first mounting units may include a first mounting member having a first recess into which a side portion of any one of the first and second guide members is inserted, a first mounting block coupled to the first mounting member so that the any one of the first and second guide members is positioned therebetween, and a first elastic member for applying an elastic force to the first mounting block so that the side portion of the any one of the first and second guide members is brought into close contact with an inner surface of the first recess.

In accordance with some embodiments of the present invention, the chamber module may further include first mounting units for mounting the first guide member in the soak chamber to enable thermal expansion or contraction of the first guide member, and second mounting units for mounting the second guide member in the soak chamber to enable thermal expansion or contraction of the second guide member and movement of the second guide member in the first horizontal direction. In such case, each of the first mounting units may include a first mounting member having a first recess into which a side portion of the first guide member is inserted, a first mounting block coupled to the first mounting member so that the first guide member is positioned therebetween, and a first elastic member for applying an elastic force to the first mounting block so that the side portion of the first guide member is brought into close contact with an inner surface of the first recess. Further, each of the second mounting units may include a second mounting member having a second recess into which a side portion of the second guide member is inserted, a second mounting block coupled to the second mounting member so that the second guide member is positioned therebetween, and a second elastic member for applying an elastic force to the second mounting block so that the side portion of the second guide member is brought into close contact with an inner surface of the second recess. Particularly, the second recess may have a width configured to allow the second guide member to move in the first horizontal direction.

In accordance with some embodiments of the present invention, the chamber module may further include a centering unit for adjusting a position of the second guide member so that the second guide member is positioned at a center of the second recess in the first horizontal direction.

In accordance with some embodiments of the present invention, the centering unit may include push members for pushing both side portions of the second guide member in the first horizontal direction, respectively, and third elastic members for applying an elastic force to the push members in the first horizontal direction, respectively.

In accordance with still another aspect of the present invention, a test handler may include a chamber module configured to adjust a temperature of the semiconductor devices accommodated in a tray and perform an electrical test on the semiconductor devices, a loader module configured to load the tray into the chamber module, and an unloader module configured to unload the tray from the chamber module. The chamber module may include a soak chamber configured to provide a temperature adjusting space for adjusting the temperature of semiconductor devices, an elevating member disposed in the soak chamber and configured to elevate the tray, a guide member extending in a vertical direction in the soak chamber and configured to guide movement of the elevating member, and a temperature adjusting part configured to adjust a temperature of the guide member.

In accordance with the embodiments of the present invention as described above, the temperature of the first and second guide members may be adjusted by the temperature adjusting part, and thus the thermal expansion or contraction of the first and second guide members may be significantly reduced. Further, the first and second mounting units may be configured to enable the thermal expansion or contraction of the first and second guide members, and the second mounting units may be configured to enable the movement of the second guide member in the first horizontal direction. Accordingly, even if the thermal expansion or contraction of the elevating member occurs, damage to the elevating member and the first and second guide members may be prevented.

The above summary of the invention is not intended to describe each illustrated embodiment or every implementation of the present invention. The detailed description and claims that follow more particularly exemplify these embodiments.

BRIEF DESCRIPTION OF THE DRAWINGS

Embodiments of the present invention can be understood in more detail from the following description taken in conjunction with the accompanying drawings, in which.

Figure 1:
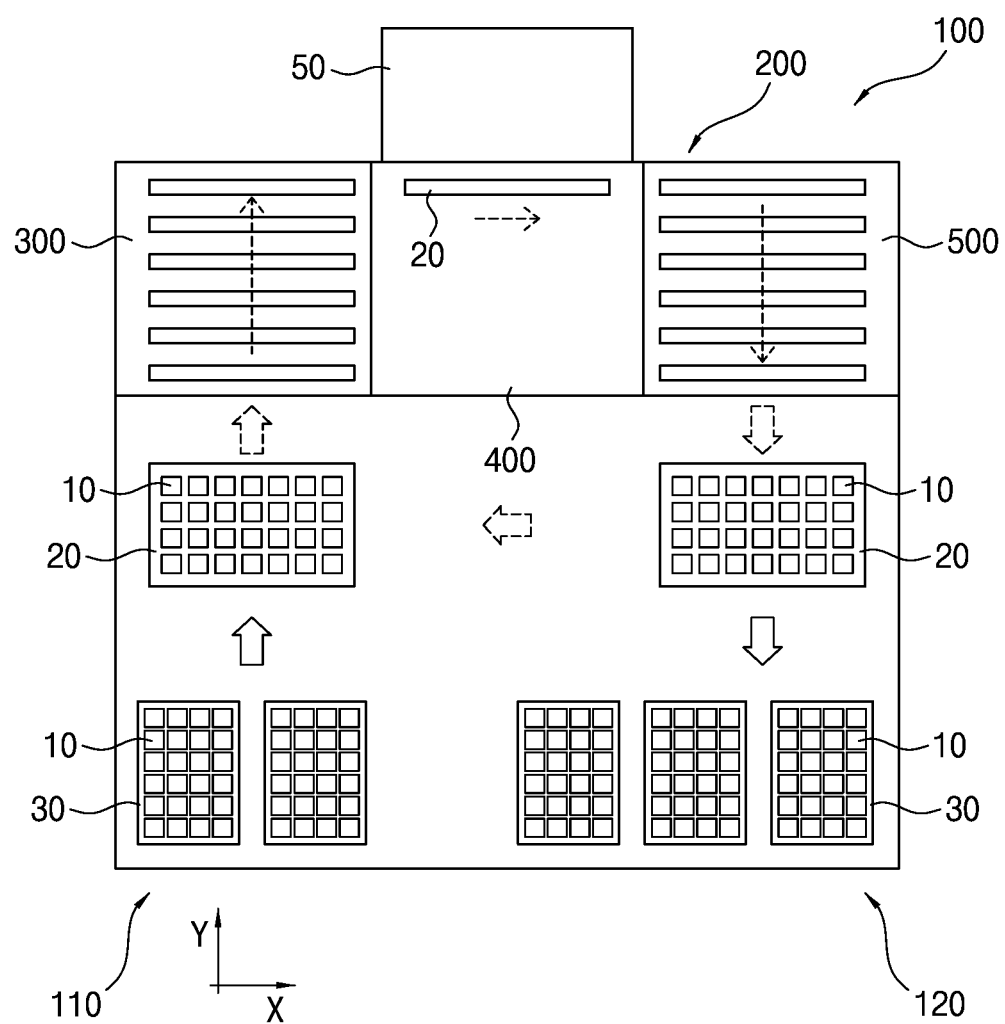
FIG. 1 is a schematic plan view illustrating a test handler in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a schematic plan view illustrating a test handler in accordance with an embodiment of the present invention.

Referring to FIG. 1, a test handler 100, in accordance with an embodiment of the present invention, may be used to electrically test semiconductor devices 10. The test handler 100 may include a chamber module 200 for electrically testing the semiconductor devices 10 accommodated in a test tray 20, a loader module 110 for accommodating the semiconductor devices 10 in the test tray 20 and loading the test tray 20 into the chamber module 200, and an unloader module 120 for unloading the test tray 20 from the chamber module 200 after a test process on the semiconductor devices 10 is performed and classifying the semiconductor devices 10 according to test results of the semiconductor devices 10.

Although not shown in FIG. 1, the test tray 20 may include insert assemblies (not shown) for accommodating the semiconductor devices 10. The loader module 110 may transfer the semiconductor devices 10 from a customer tray 30 to the test tray 20, and then transfer the test tray 20 into the chamber module 200. After the test process is completed, the unloader module 120 may classify the semiconductor devices 10 according to the test results and transfer to customer trays 30. Further, the unloader module 120 may transfer the test tray 20 to the loader module 110.

The loader module 110 may include a first device transfer unit (not shown) for transferring the semiconductor devices 10 from the customer tray 30 to the test tray 20, and the unloader module 120 may include a second device transfer unit (not shown) for transferring the semiconductor devices 10 from the test tray 20 to the customer trays 30.

The chamber module 200 may include a test chamber 400 providing a test space for electrically test the semiconductor devices 10, an soak chamber 300 connected to one side of the test chamber 400 and configured to adjust a temperature of the semiconductor devices 10 to a predetermined test temperature, and a de-soak chamber 500 connected to another side of the test chamber 400 and configured to restore the temperature of the semiconductor devices 10 to a room temperature after the test process is completed.

The test tray 20 may be loaded into the soak chamber 300, and preheating or pre-cooling of the semiconductor devices 10 may be performed in the soak chamber 300. Then, the test tray 20 may be transferred to the test chamber 400, and may be transferred to the de-soak chamber 500 after the test process is performed. The temperature of the semiconductor devices 10 may be restored to the room temperature in the de-soak chamber 500, and then the test tray 20 may be unloaded from the de-soak chamber 500.

Although not shown in FIG. 1, the loader module 110 may include a first rotation unit (not shown) for rotating the test tray 20 in a vertical direction, and may transfer the test tray 20 into the soak chamber 300 in a state in which the test tray 20 is erected in the vertical direction. The test tray 20 may be moved in a horizontal direction, for example, in a Y-axis direction in the soak chamber 300, and the temperature of the semiconductor devices 10 accommodated in the test tray 20 may be adjusted while the test tray 20 is moved. Subsequently, the test tray 20 may be transferred to the test chamber 400 in a horizontal direction, for example, in an X-axis direction. After the test process is performed, the test tray 20 may be transferred to the de-soak chamber 500 in the X-axis direction. The test tray 20 may be moved in the de-soak chamber 500 in a direction opposite to the movement direction in the soak chamber 300, that is, in a negative Y-axis direction, and the temperature of the semiconductor devices 10 may be restored to the room temperature during the movement. The unloader module 120 may include a second rotation unit (not shown) for horizontally rotating the test tray 20 unloaded from the de-soak chamber 500.

Figure 2:
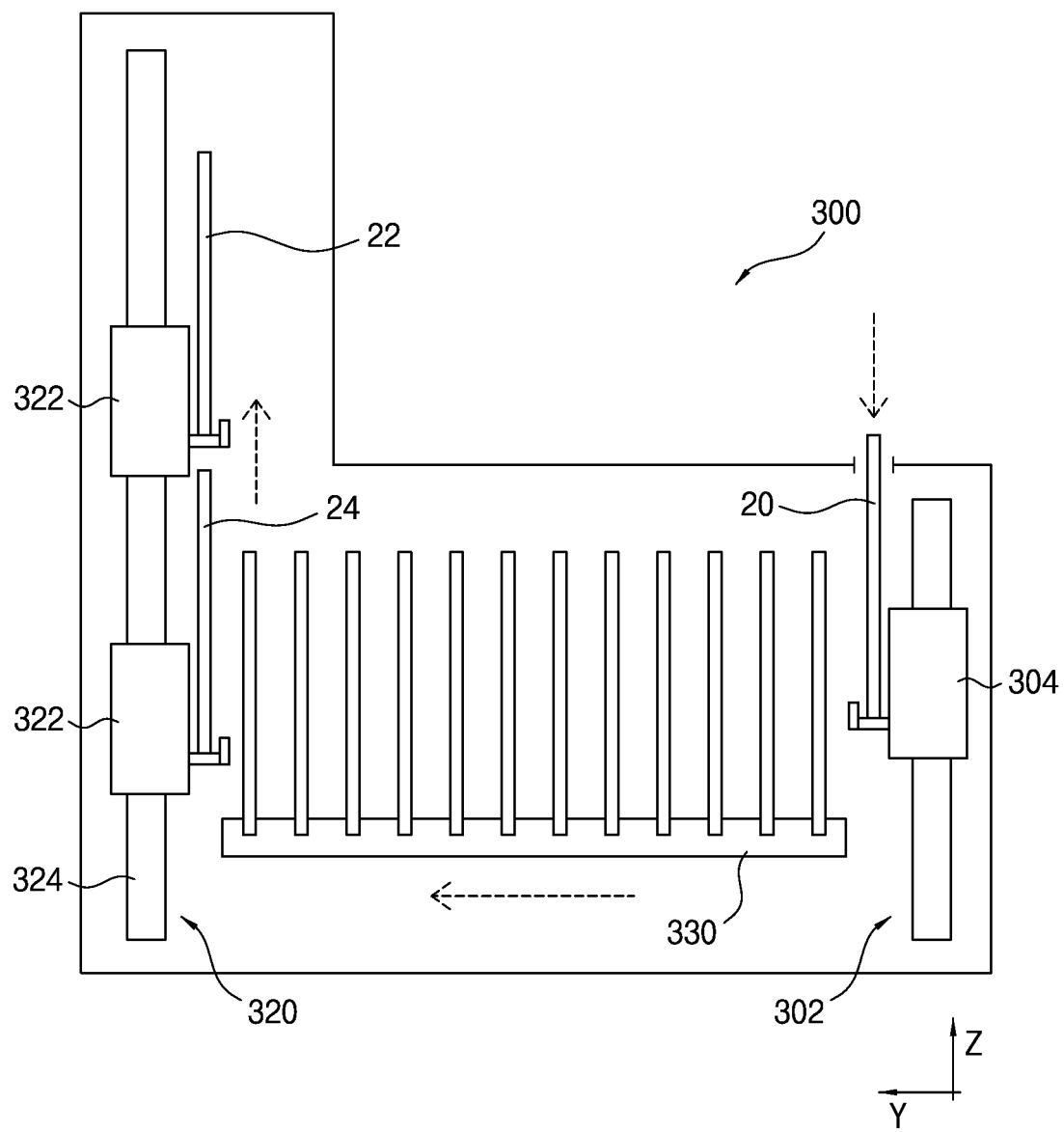
FIG. 2 is a schematic left side view illustrating a soak chamber as shown in FIG. 1.

FIG. 2 is a schematic left side view illustrating the soak chamber 300 as shown in FIG. 1.

Referring to FIG. 2, the soak chamber 300 may provide a temperature adjusting space for adjusting the temperature of the semiconductor devices 10, and a first elevator 302 for transferring the test tray 20 into the soak chamber 300 may be disposed on one side of the inner space of the soak chamber 300, that is, the temperature adjusting space. Further, a second elevator 320 for transferring the test tray 20 to the test chamber 400 may be disposed on another side of the inner space of the soak chamber 300, and a first tray transfer unit 330 for moving the test tray 20 in the Y-axis direction from the first elevator 302 to the second elevator 320 may be disposed in the soak chamber 300. For example, Korean Patent Application Laid-Open No. 10-2016-0053157 discloses a test tray transfer apparatus for moving the test tray 20 in the soak chamber 300, and the first tray transfer unit 330 may be configured substantially the same as the test tray transfer apparatus.

Figure 3:
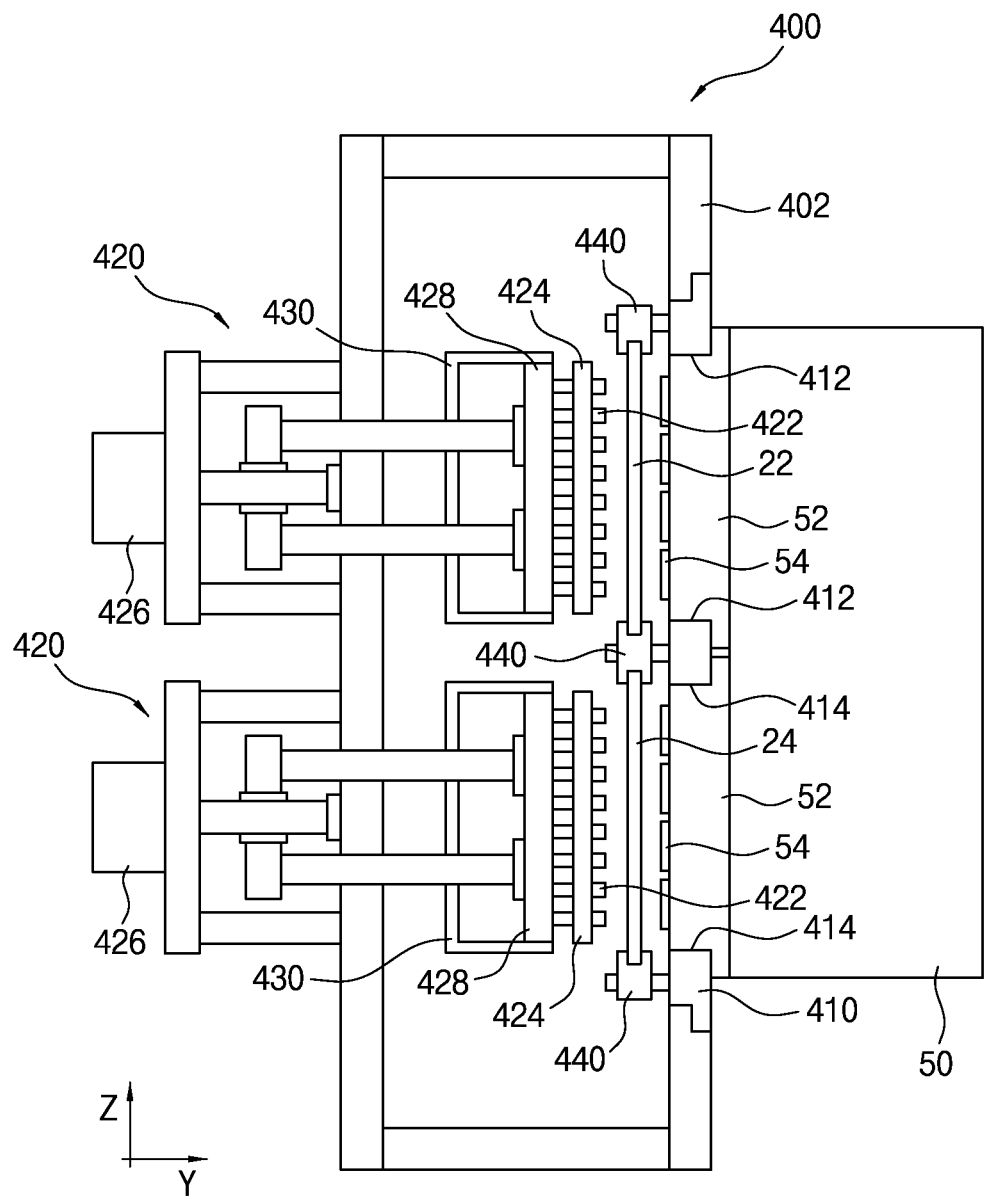
FIG. 3 is a schematic right side view illustrating a test chamber as shown in FIG. 1.

FIG. 3 is a schematic right side view illustrating the test chamber 400 as shown in FIG. 1.

Referring to FIG. 3, the test chamber 400 may provide a test space for electrical testing of the semiconductor devices 10. For example, two test trays 22 and 24 may be supplied into upper and lower portions of the test chamber 400, respectively, as shown in FIG. 3.

A tester 50 providing test signals for the electrical testing of the semiconductor devices 10 may be connected to an outside of a sidewall 402 of the test chamber 400, and a DUT (Device Under Test) plate 410 having an upper opening 412 for connecting the semiconductor devices 10 accommodated in an upper test tray 22 to the tester 50 and a lower opening 414 for connecting the semiconductor devices 10 accommodated in a lower test tray 24 to the tester 50 may be mounted to the sidewall 402 of the test chamber 400. Further, Interface boards 52 for electrically connecting the semiconductor devices 10 and the tester 50 may be disposed in the upper opening 412 and the lower opening 414, respectively, and socket boards 54 for connection with the semiconductor devices 10 may be mounted on the interface boards 52.

The test chamber 400 may include a pushing unit 420 for bringing the semiconductor devices 10 into contact with the socket boards 54. The pushing unit 420 is may include match plates 424 on which pushers 422 for bringing the semiconductor devices 10 into contact with the socket boards 54 are mounted, driving parts 426 for providing a pressing force to the match plates 424, and pressing plates 428 for transmitting the pressing force to the match plates 424. Further, ducts 430 through which a temperature adjusting gas for adjusting a temperature of the pushers 422, e.g., heated air or cooling gas is provided may be connected to rear portions of the pressing plates 428, respectively.

Although not shown in FIG. 3, the chamber module 200 may include a second tray transfer unit (not shown) for transferring the upper test tray 22 and the lower test tray 22 from the soak chamber 300 into the test chamber 400. Guide rails 440 for guiding the upper test tray 22 and the lower test tray 24 may be mounted on an inner surface of the DUT plate 410, and the second tray transfer unit may move the upper test tray 22 and the lower test tray 24 from the second elevator 320 along the guide rails 440 into the test chamber 400.

Figure 4:
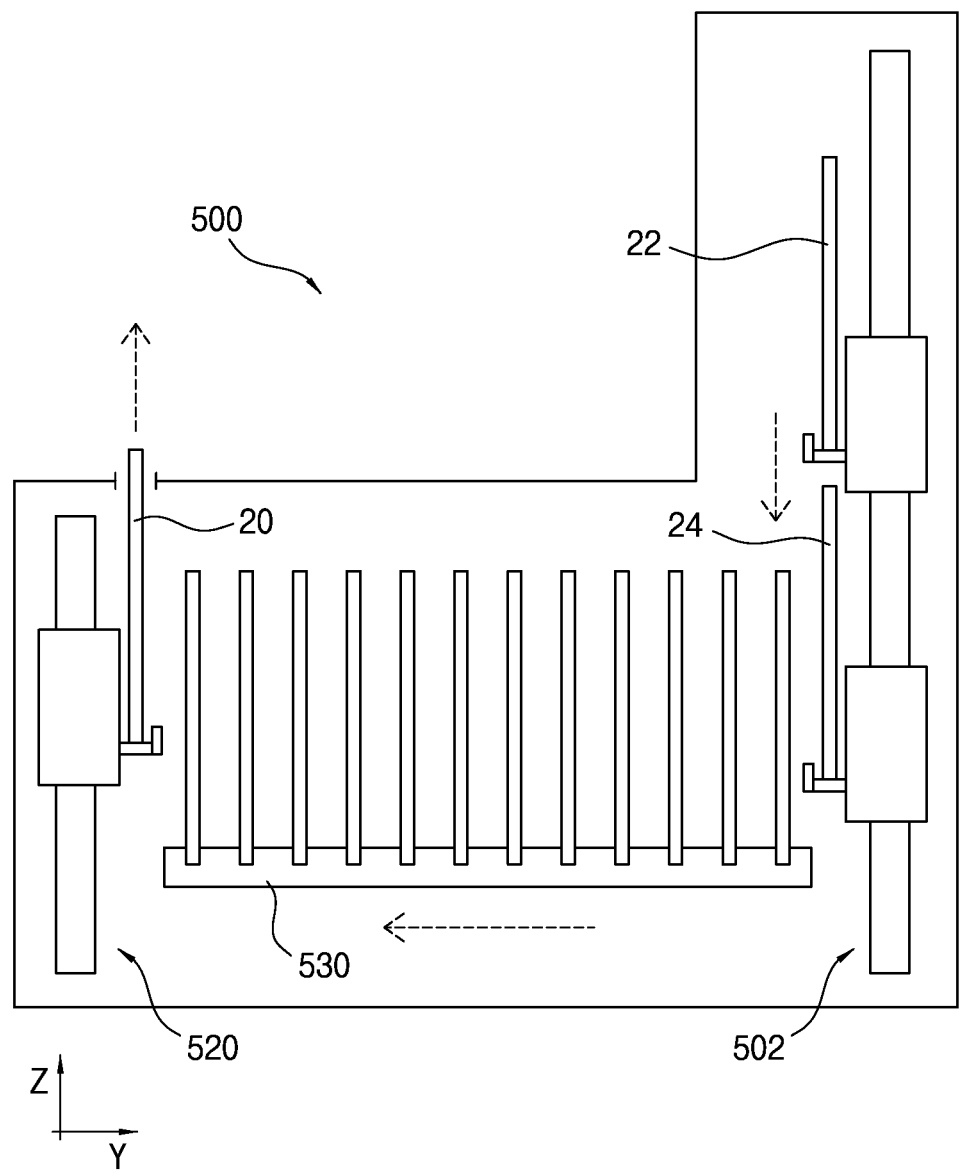
FIG. 4 is a schematic right side view illustrating a de-soak chamber as shown in FIG. 1.

FIG. 4 is a schematic right side view illustrating the de-soak chamber 500 as shown in FIG. 1.

Referring to FIG. 4, the de-soak chamber 500 may be used to restore the temperature of the semiconductor devices 10 to the room temperature. A third elevator 502 may be disposed on one side of an inner space of the de-soak chamber 500, and a fourth elevator 520 may be disposed on another side of the inner space of the de-soak chamber 500. Further, although not shown in FIG. 4, the chamber module 200 may include a third tray transfer unit (not shown) for moving the upper test tray 22 and the lower test tray 24 from the test chamber 400 to the de-soak chamber 500, and the de-soak chamber 500 may include a fourth tray transfer unit 530 for moving the upper test tray 22 and the lower test tray 24 from the third elevator 502 to the fourth elevator 520.

Figure 5:
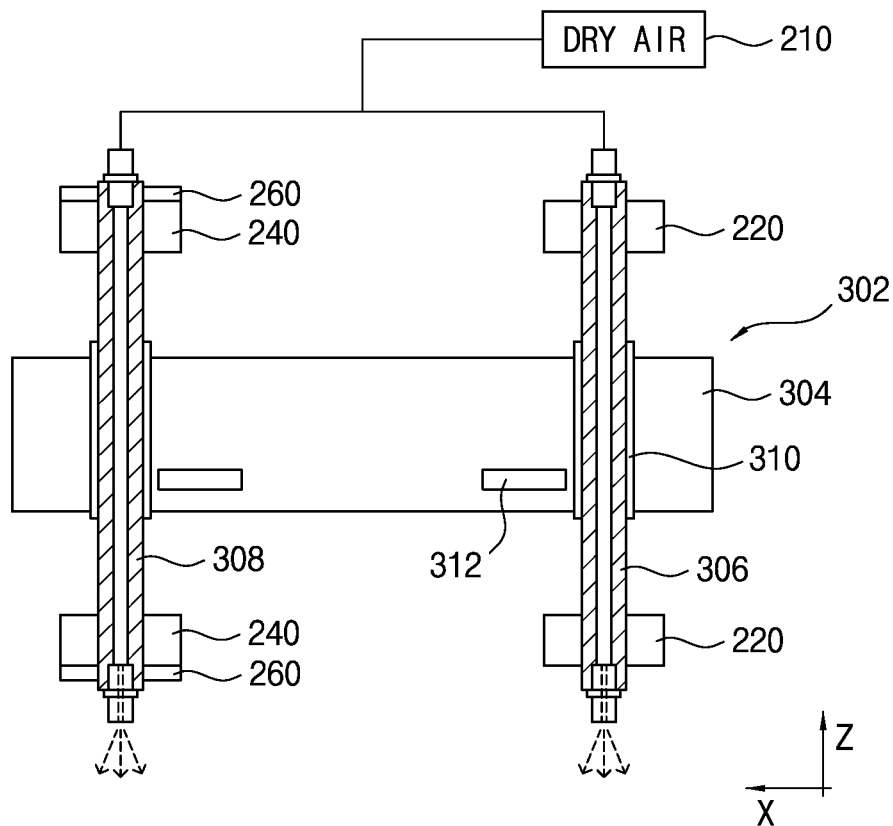
FIG. 5 is a schematic rear view illustrating a first elevator as shown in FIG. 2.

FIG. 5 is a schematic rear view illustrating the first elevator 302 as shown in FIG. 2.

Referring to FIG. 5, the first elevator 302 may include an elevating member 304 for elevating the test tray 20, and a pair of guide members 306 and 308 extending in a vertical direction in the soak chamber 300 and for guiding the elevating member 304 in the vertical direction. In accordance with an embodiment of the present invention, the first elevator 302 may include a first guide member 306 extending in the vertical direction, and a second guide member 308 disposed to be spaced apart from the first guide member 306 in a first horizontal direction, for example, an X-axis direction and extending in the vertical direction. Each of the first and second guide members 306 and 308 may have a form of a hollow shaft extending in the vertical direction passing through the elevating member 304, and bush members 310 surrounding the first and second guide members 306 and 308, respectively, may be mounted on the elevating member 304.

Although not shown in figures, the soak chamber 300 may include first nozzles (not shown) for supplying heated air into the soak chamber 300 to preheat the semiconductor devices 10, and second nozzles (not shown) for supplying a cooling gas into the soak chamber 300 to pre-cool the semiconductor devices 10. For example, the semiconductor devices 10 may be preheated to a temperature of about 150° C. by the heated air. As another example, the semiconductor devices 10 may be pre-cooled to a temperature of about −60° C. by the cooling gas, for example, liquid nitrogen gas.

In accordance with an embodiment of the present invention, the chamber module 200 may include a temperature adjusting part 210 for adjusting a temperature of the first and second guide members 306 and 308. The temperature adjusting part 210 may supply a temperature adjusting medium into hollows of the first and second guide members 306 and 308 in order to reduce thermal deformation, that is, thermal expansion or contraction, of the first and second guide members 306 and 308. For example, a dry air at room temperature, e.g., a dry air having a temperature of about 15° C. to about 30° C. may be used as the temperature adjusting medium. Further, for example, the temperature adjusting part 210 may be connected to upper ends of the first and second guide members 306 and 308, and the dry air supplied into the first and second guide members 306 and 308 may be supplied into the soak chamber 300 through lower ends of the first and second guide members 306 and 308. In this case, the dry air may have a dew point lower than the pre-cooling temperature of the semiconductor devices 10 in order to prevent dew condensation. For example, the dry air may have a dew point of about −70° C.

Although not shown in figures, temperature sensors (not shown) for measuring the temperature of the first and second guide members 306 and 308 may be mounted on the first and second guide members 306 and 308, and the temperature adjusting part 210 may include a flow control valve (not shown) for controlling a flow rate of the dry air based on the temperature of the first and second guide members 306 and 308 measured by the temperature sensors. Further, each of the first and second guide members 306 and 308 may have a protective layer formed by a surface treatment. For example, the protective layer may be formed on outer surfaces of the first and second guide members 306 and 308 by a Raydent coating process.

The soak chamber 300 may have an inlet disposed above the first elevator 302 as shown in FIG. 2, and the test tray 20 may be transferred from the first rotation unit to the first elevator 302 through the inlet. Support members 312 for supporting the test tray 20 may be mounted on a side surface of the elevating member 304, and the first elevator 302 may include a first driving unit (not shown) for vertically moving the elevating member 304. For example, although not shown in figures, the first driving unit may vertically move the elevating member 304 using a pneumatic cylinder and a link mechanism. In such case, the pneumatic cylinder may be disposed on the outside of the soak chamber 300, and the link mechanism may include an outer link connected to the pneumatic cylinder, an inner link connected to the elevating member 304, and a connecting shaft connecting the outer link and the inner link through a side wall of the soak chamber 300. Further, the soak chamber 300 may include a first door (not shown) for opening and closing the inlet.

In accordance with an embodiment of the present invention, the chamber module 200 may include first mounting units 220 and second mounting units 240 for mounting the first and second guide members 306 and 308 in the soak chamber 300. For example, the first mounting units 220 and the second mounting units 240 may be mounted on an inner surface of the side wall of the soak chamber 300. The first mounting units 220 may grip upper and lower portions of the first guide member 306, respectively, and the second mounting units 240 may grip upper and lower portions of the second guide member 308, respectively.

Figure 6:
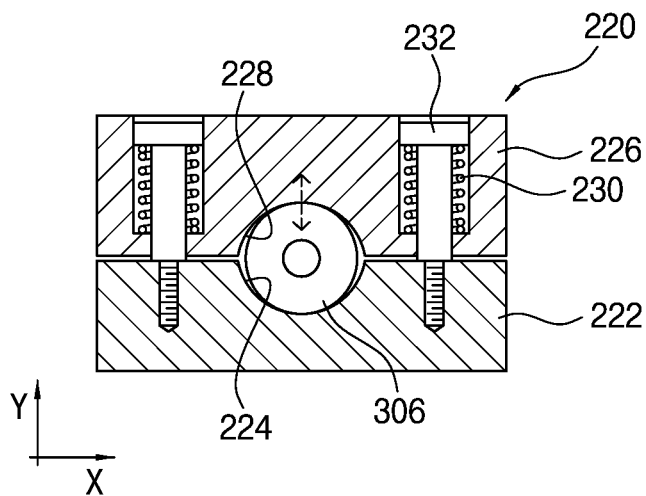
FIG. 6 is a schematic cross-sectional view illustrating a first mounting unit as shown in FIG. 5.
Figure 7:
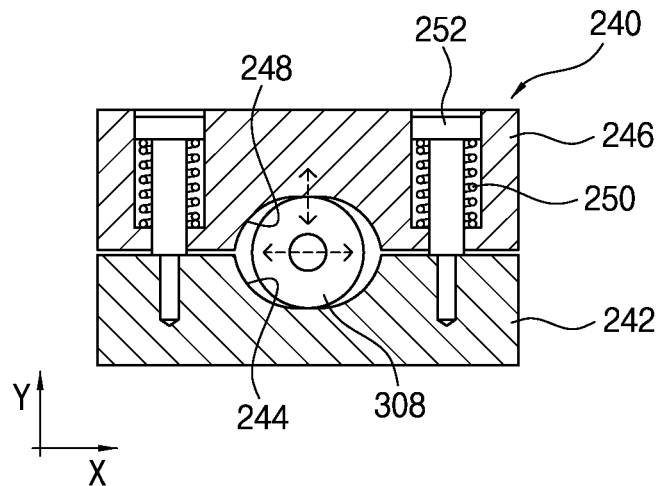
FIG. 7 is a schematic cross-sectional view illustrating a second mounting unit as shown in FIG. 5.

FIG. 6 is a schematic cross-sectional view illustrating the first mounting unit 220 as shown in FIG. 5, and FIG. 7 is a schematic cross-sectional view illustrating the second mounting unit 240 as shown in FIG. 5.

Referring to FIG. 6, the first mounting units 220 may mount the first guide member 306 in the soak chamber 300 to enable thermal expansion or contraction of the first guide member 306.

In accordance with an embodiment of the present invention, each of the first mounting units 220 may include a first mounting member 222 having a first recess 224 into which a side portion of the first guide member 306 is inserted, a first mounting block 226 coupled to the first mounting member 222 so that the first guide member 306 is positioned between the first mount member 222 and the first mounting block 226, and a first elastic member 230 for applying an elastic force to the first mounting block 226 so that the side portion of the first guide member 306 is brought into close contact with an inner surface of the first recess 224.

For example, the first recess 224 may have a radius of curvature greater than an outer radius of the first guide member 306 to enable the thermal expansion of the first guide member 306. The first mounting block 226 may have a recess 228 into which another side portion of the first guide member 306 is inserted, and the recess 228 may have the same radius of curvature as the first recess 224.

The first mounting block 226 may be coupled to the first mounting member 222 by a plurality of bolts 232. The bolts 232 may pass through the first mounting block 226 and may be fastened to the first mounting member 222. The first mounting block 226 may have through-holes through which the bolts 232 pass, and, for example, coil springs may be used as the first elastic members 230. The coil springs may be disposed between the heads of the bolts 232 and the first mounting block 226. For example, the through-holes may have stepped portions into which the heads of the bolts 232 are inserted, respectively, and the coil springs may be disposed in the stepped portions, respectively.

Referring to FIG. 7, the second mounting units 240 may mount the second guide member 308 in the soak chamber 300 to enable thermal expansion or contraction of the second guide member 308 and movement of the second guide member 308 in the first horizontal direction, that is, in the X-axis direction.

In accordance with an embodiment of the present invention, each of the second mounting units 240 may include a second mounting member 242 having a second recess 244 into which a side portion of the second guide member 308 is inserted, a second mounting block 246 coupled to the second mounting member 242 so that the second guide member 308 is positioned between the second mount member 242 and the second mounting block 246, and a second elastic member 250 for applying an elastic force to the second mounting block 246 so that the side portion of the second guide member 308 is brought into close contact with an inner surface of the second recess 244.

For example, the second recess 244 may have a radius of curvature greater than an outer radius of the second guide member 308 to enable the thermal expansion of the second guide member 308. The second mounting block 246 may have a recess 248 into which another side portion of the second guide member 308 is inserted, and the recess 248 may have the same radius of curvature as the second recess 244.

The second mounting block 246 may be coupled to the second mounting member 242 by a plurality of bolts 252. The bolts 252 may pass through the second mounting block 246 and may be fastened to the second mounting member 242. The second mounting block 246 may have through-holes through which the bolts 252 pass, and, for example, coil springs may be used as the second elastic members 250. The coil springs may be disposed between the heads of the bolts 252 and the second mounting block 246. For example, the through-holes may have stepped portions into which the heads of the bolts 252 are inserted, respectively, and the coil springs may be disposed in the stepped portions, respectively.

In accordance with an embodiment of the present invention, the second recess 244 may have a width wider than the second guide member 308 so that the second guide member 308 is movable in the first horizontal direction, that is, in the X-axis direction. Further, the recess 248 of the second mounting block 246 may have the same width as the second recess 244. Specifically, the second recess 244 and the recess 248 of the second mounting block 246 may extend in the first horizontal direction, and thus the movement of the second guide member 308 in the first horizontal direction may be enabled. As a result, even when the elevating member 304 is thermally expanded or contracted in the first horizontal direction, damage to the elevating member 304 and the first and second guide members 306 and 308 may be prevented.

Referring again to FIG. 5, the chamber module 200 may include centering units 260 for adjusting a position of the second guide member 308 so that the second guide member 308 is positioned at a center of the second recess 244 in the first horizontal direction. The centering units 260 may be mounted to the second mounting units 240. In particular, the centering units 260 may be respectively mounted to the second mounting members 242.

Figure 8:
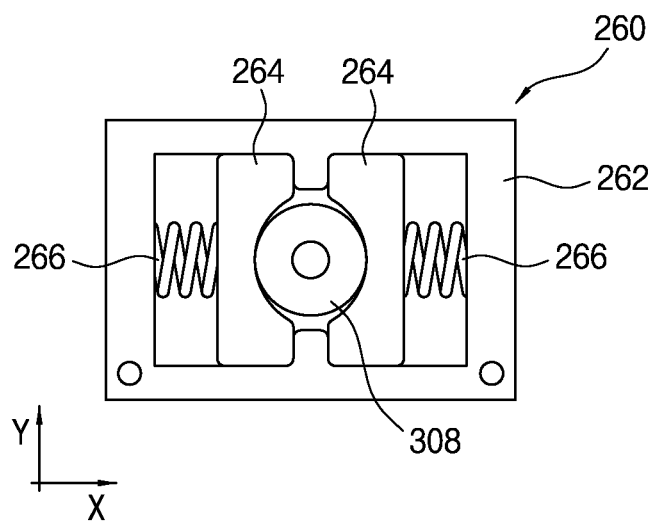
FIG. 8 is a schematic plan view illustrating a centering unit as shown in FIG. 5.

FIG. 8 is a schematic plan view illustrating the centering unit 260 as shown in FIG. 5.

Referring to FIG. 8, the centering unit 260 may include a frame 262 having an opening through which the second guide member 308 passes, push members 264 disposed in the opening and for pushing both side portions of the second guide member 308 in the first horizontal direction, respectively, and third elastic members 266 for applying an elastic force to the push members 264 in the first horizontal direction, respectively. For example, the push members 264 may each have a recess into which the second guide member 308 is partially inserted. Further, coil springs may be used as the third elastic members 266, and may be respectively disposed between the push members 264 and the frame 262 in the opening.

In accordance with an embodiment of the present invention, the temperature of the first and second guide members 306 and 308 may be adjusted by the temperature adjusting part 210, and thus the thermal expansion or contraction of the first and second guide members 306 and 308 may be significantly reduced. Further, the first and second mounting units 220 and 240 may be configured to enable the thermal expansion or contraction of the first and second guide members 306 and 308. Particularly, the second mounting units 240 may be configured to enable the movement of the second guide member 308 in the first direction. Accordingly, even when the thermal expansion or contraction of the elevating member 304 occurs, damage to the elevating member 304 and the first and second guide members 306 and 308 may be prevented.

Referring again to FIG. 2, the second elevator 320 may have substantially the same configuration as the first elevator 302. However, the second elevator 320 may include two second elevating members 322 to transfer the upper test tray 22 and the lower test tray 24 to the test chamber 400, and further include two second driving units (not shown) for elevating the second elevating members 322. In such case, a temperature of guide members 324 of the second elevator 320 may be adjusted by the temperature adjusting part 210.

Referring again to FIG. 4, the third elevator 502 may have substantially the same configuration as the second elevator 320, and the fourth elevator 520 may have substantially the same configuration as the first elevator 302. However, in the case of the de-soak chamber 500, since there is no need to consider thermal expansion or thermal contraction according to temperature change, the guide members of the third elevator 502 and the fourth elevator 520 do not need to have a hollow shaft shape, and there is no need to provide a separate temperature adjusting part. In addition, there is no need to consider thermal expansion or thermal contraction even in the case of mounting units for mounting the guide members in the de-soak chamber 500. On the other hand, the fourth tray transfer unit 530 disposed in the de-soak chamber 500 may have substantially the same configuration as the first tray transfer unit 330.

The de-soak chamber 500 may have an outlet for unloading the test tray 20, and the outlet may be disposed above the fourth elevator 520. Although not shown in figures, the de-soak chamber 500 may include a fourth door (not shown) for opening and closing the outlet. Further, a first passage for transferring the upper and lower test trays 22 and 24 may be provided between the soak chamber 300 and the test chamber 400, and a second passage for transferring the upper and lower test trays 22 and 24 may be provided between the test chamber 400 and the de-soak chamber 500. In this case, the chamber module 200 may include second and third doors (not shown) for opening and closing the first and second passages, respectively.

Figure 9:
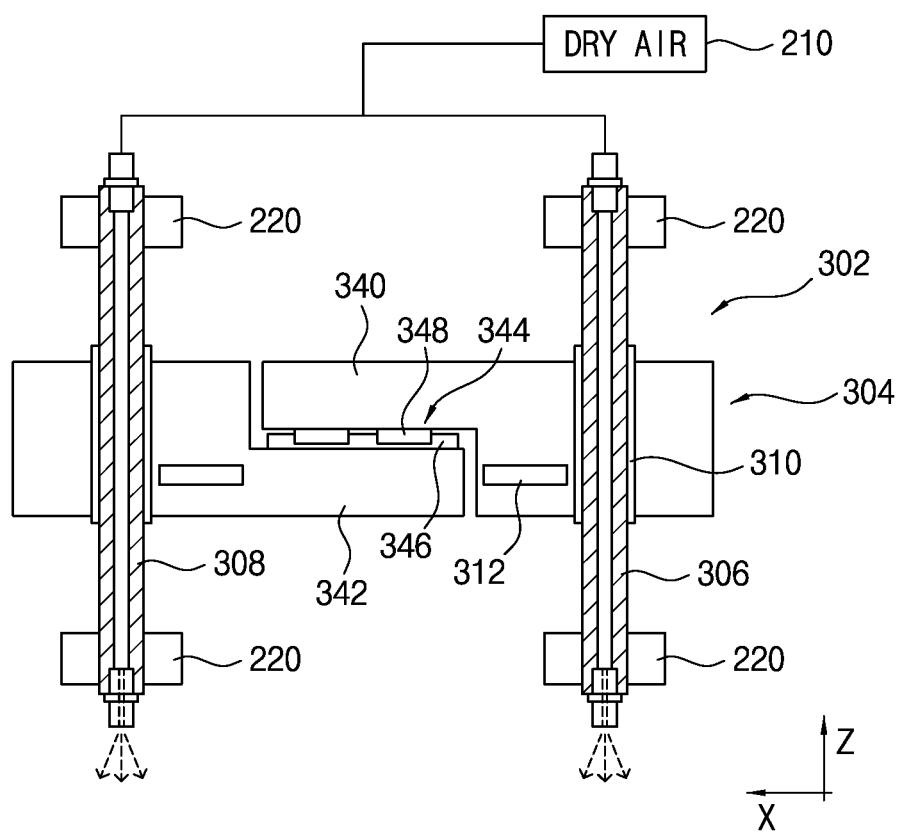
FIG. 9 is a schematic rear view illustrating another example of the first elevator as shown in FIG. 2.

FIG. 9 is a schematic rear view illustrating another example of the first elevator 302 as shown in FIG. 2.

Referring to FIG. 9, the elevating member 304 may include a first elevating member 340 guided in the vertical direction by the first guide member 306, and a second elevating member 342 guided in the vertical direction by the second guide member 308. Particularly, a slide unit 344 may be disposed between the first elevating member 340 and the second elevating member 342. The slide unit 344 may connect the first elevating member 340 and the second elevating member 342 to each other so that the first elevating member 340 and the second elevating member 342 are relatively movable to each other in the first horizontal direction.

For example, the slide unit 344 may include a slide rail 346 mounted on the second elevating member 342 and extending in the first horizontal direction, and a movable block 348 mounted on the first elevating member 340 and coupled to the slide rail 346 so as to be movable along the slide rail 346. Accordingly, even when the first and second elevating members 340 and 342 are thermally expanded or contracted, damage to the first and second elevating members 340 and 342 and the first and second guide members 306 and 308 may be prevented by the slide unit 344. In this case, both the first and second guide members 306 and 308 may be mounted in the soak chamber 300 by the first mounting units 220 as shown in FIG. 9.

Figure 10:
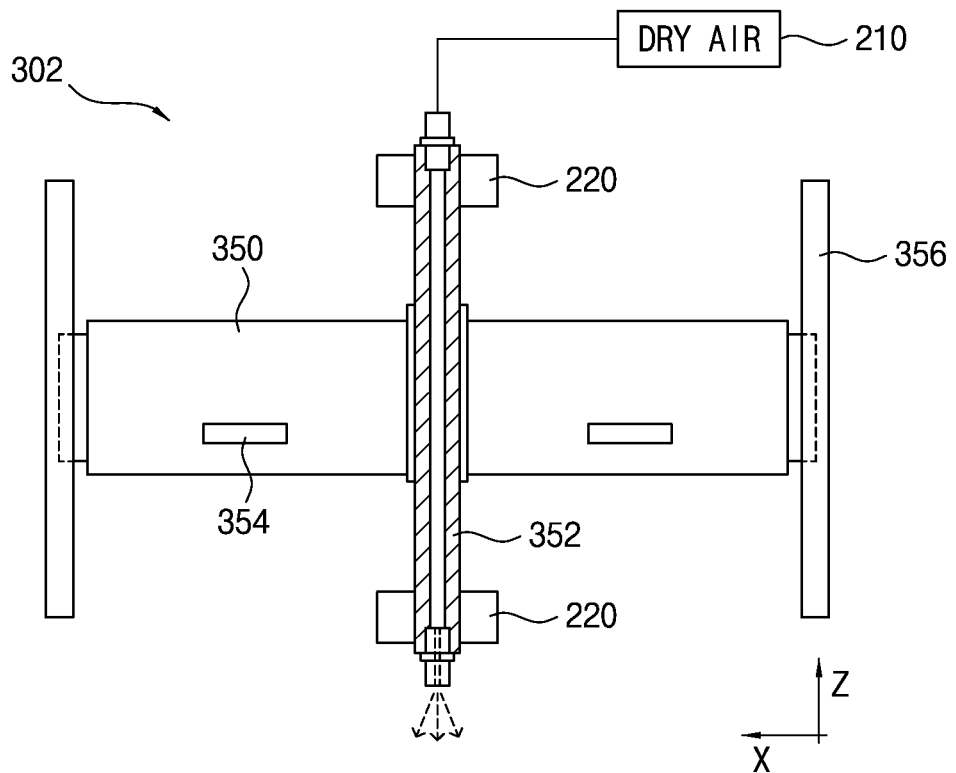
FIG. 10 is a schematic rear view illustrating still another example of the first elevator as shown in FIG. 2.
Figure 11:
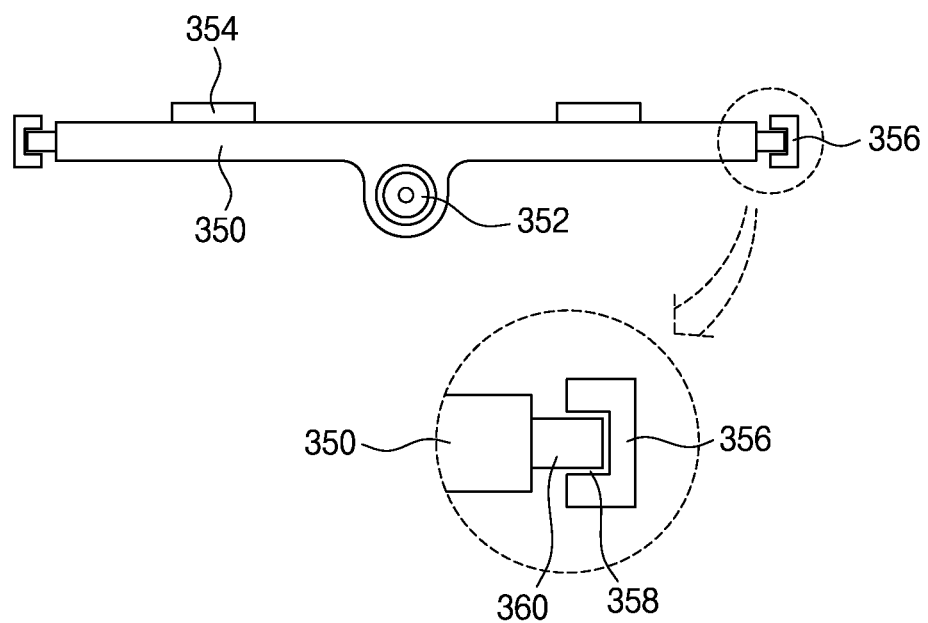
FIG. 11 is a schematic plan view illustrating a first elevator as shown in FIG. 10.

FIG. 10 is a schematic rear view illustrating still another example of the first elevator 302 as shown in FIG. 2, and FIG. 11 is a schematic plan view illustrating the first elevator 302 as shown in FIG. 10.

Referring to FIGS. 10 and 11, the first elevator 302 may include an elevating member 350 for elevating the test tray 20 and one guide member 352 for guiding the movement of the elevating member 350. Support members 354 for supporting the test tray 20 may be mounted on a side of the elevating member 350, and the guide member 352 may have a hollow shaft shape and may extend vertically through the elevating member 350.

The guide member 352 may be connected to the temperature adjusting part 210, and the temperature adjusting part 210 may supply a temperature adjusting medium into a hollow of the guide member 352. The guide member 352 may be mounted on the inner surface of the side wall of the soak chamber 300 by the first mounting units 220.

The first elevator 302 may include guide rails 356 for guiding both side portions of the elevating member 350 in the vertical direction. The guide rails 356 may extend in the vertical direction, and may each include guide slots 358 formed in the vertical direction to guide the elevating member 350. Protrusions 360 respectively inserted into the guide slots 358 and extending in the vertical direction may be provided at both side ends of the elevating member 350. In particular, inner surfaces of the guide slots 358 may be spaced apart from outer surfaces of the protrusions 360 by a predetermined distance. Accordingly, even when the elevating member 350 is thermally expanded, the protrusions 360 may be prevented from being brought into contact with the guide slots 358. As a result, even when the elevating member 350 thermally expands, damage to the elevating member 350 and the guide rails 356 may be prevented.

In accordance with the embodiments of the present invention as described above, the temperature of the first and second guide members 306 and 308 and the guide member 352 may be adjusted by the temperature adjusting part 210, and the first and second mounting units 220 and 240 may be configured to enable the thermal expansion or contraction of the first and second guide members 306 and 308 and the guide member 352. Accordingly, damage to the first and second elevators 302 and 320 may be prevented.

Although the example embodiments of the present invention have been described with reference to the specific embodiments, they are not limited thereto. Therefore, it will be readily understood by those skilled in the art that various modifications and changes can be made thereto without departing from the spirit and scope of the appended claims.

The invention claimed is:
1. A chamber module comprising:
a soak chamber configured to provide a temperature adjusting space for adjusting a temperature of semiconductor devices;
an elevating member disposed in the soak chamber and configured to elevate a tray in which the semiconductor devices are accommodated;
a guide member extending in a vertical direction in the soak chamber and configured to guide movement of the elevating member; and
a temperature adjusting part configured to adjust a temperature of the guide member,
wherein the guide member has a form of a hollow shaft, and the temperature adjusting part supplies a temperature adjusting medium into a hollow of the guide member.

2. The chamber module of claim 1, wherein a dry air is used as the temperature adjusting medium.

3. The chamber module of claim 1, wherein the guide member extends in the vertical direction through the elevating member, and a bush member surrounding the guide member is mounted to the elevating member.

4. The chamber module of claim 1, further comprising guide rails configured to guide both side portions of the elevating member in the vertical direction.

5. The chamber module of claim 1, wherein the guide member has a protective layer formed by a surface treatment.

6. A chamber module comprising:
a soak chamber configured to provide a temperature adjusting space for adjusting a temperature of semiconductor devices;
an elevating member disposed in the soak chamber and configured to elevate a tray in which the semiconductor devices are accommodated;
a first guide member extending in a vertical direction in the soak chamber and configured to guide movement of the elevating member;
a second guide member extending in the vertical direction in the soak chamber, disposed to be spaced apart from the first guide member in a first horizontal direction, and configured to guide the movement of the elevating member; and
a temperature adjusting part configured to adjust a temperature of the first and second guide members,
wherein each of the first and second guide members has a form of a hollow shaft, and the temperature adjusting part supplies a temperature adjusting medium into hollows of the first and second guide members.

7. The chamber module of claim 6, wherein a dry air is used as the temperature adjusting medium and is supplied into the soak chamber through the first and second guide members.

8. The chamber module of claim 6, further comprising:
a test chamber connected to the soak chamber and configured to provide a test space for electrically testing the semiconductor devices; and
a de-soak chamber connected to the test chamber and configured to restore the temperatures of the semiconductor devices to a room temperature.

9. The chamber module of claim 6, wherein the elevating member comprises:
a first elevating member guided in the vertical direction by the first guide member; and
a second elevating member guided in the vertical direction by the second guide member.

10. The chamber module of claim 9, further comprising:
a slide unit connecting the first elevating member and the second elevating member to each other so that the first elevating member and the second elevating member are relatively movable to each other in the first horizontal direction.

11. The chamber module of claim 10, further comprising:
first mounting units for mounting the first and second guide members in the soak chamber to enable thermal expansion or contraction of the first and second guide members.

12. The chamber module of claim 11, wherein each of the first mounting units comprises:
a first mounting member having a first recess into which a side portion of any one of the first and second guide members is inserted;
a first mounting block coupled to the first mounting member so that the any one of the first and second guide members is positioned therebetween; and
a first elastic member for applying an elastic force to the first mounting block so that the side portion of the any one of the first and second guide members is brought into close contact with an inner surface of the first recess.

13. The chamber module of claim 6, further comprising:
first mounting units for mounting the first guide member in the soak chamber to enable thermal expansion or contraction of the first guide member; and
second mounting units for mounting the second guide member in the soak chamber to enable thermal expansion or contraction of the second guide member and movement of the second guide member in the first horizontal direction.

14. The chamber module of claim 13, wherein each of the first mounting units comprises:
a first mounting member having a first recess into which a side portion of the first guide member is inserted;
a first mounting block coupled to the first mounting member so that the first guide member is positioned therebetween; and
a first elastic member for applying an elastic force to the first mounting block so that the side portion of the first guide member is brought into close contact with an inner surface of the first recess.

15. The chamber module of claim 13, wherein each of the second mounting units comprises:
a second mounting member having a second recess into which a side portion of the second guide member is inserted;
a second mounting block coupled to the second mounting member so that the second guide member is positioned therebetween; and
a second elastic member for applying an elastic force to the second mounting block so that the side portion of the second guide member is brought into close contact with an inner surface of the second recess,
wherein the second recess has a width configured to allow the second guide member to move in the first horizontal direction.

16. The chamber module of claim 15, further comprising;
a centering unit for adjusting a position of the second guide member so that the second guide member is positioned at a center of the second recess in the first horizontal direction.

17. The chamber module of claim 16, wherein the centering unit comprises:
push members for pushing both side portions of the second guide member in the first horizontal direction, respectively; and
third elastic members for applying an elastic force to the push members in the first horizontal direction, respectively.

18. A test handler comprising:
a chamber module configured to adjust a temperature of the semiconductor devices accommodated in a tray and perform an electrical test on the semiconductor devices;
a loader module configured to load the tray into the chamber module; and
an unloader module configured to unload the tray from the chamber module,
wherein the chamber module comprises:

a soak chamber configured to provide a temperature adjusting space for adjusting the temperature of semiconductor devices;

an elevating member disposed in the soak chamber and configured to elevate the tray;

a guide member extending in a vertical direction in the soak chamber and configured to guide movement of the elevating member; and a temperature adjusting part configured to adjust a temperature of the guide member, wherein the guide member has a form of a hollow shaft, and the temperature adjusting part supplies a temperature adjusting medium into a hollow of the guide member.

* * * * *